United States Patent

Sliwa, Jr. et al.

[11] Patent Number: 5,119,164
[45] Date of Patent: Jun. 2, 1992

[54] AVOIDING SPIN-ON-GLASS CRACKING IN HIGH ASPECT RATIO CAVITIES

[75] Inventors: John W. Sliwa, Jr., Palo Alto; Pankaj Dixit, San Jose, both of Calif.

[73] Assignee: Advanced Micro Devices, Inc., Sunnyvale, Calif.

[21] Appl. No.: 652,306

[22] Filed: Feb. 5, 1991

Related U.S. Application Data

[63] Continuation of Ser. No. 385,649, Jul. 25, 1989, abandoned.

[51] Int. Cl.⁵ .................. H01L 29/34; H01L 23/48; H01L 29/46
[52] U.S. Cl. .......................... 357/54; 357/71
[58] Field of Search ............. 357/71, 73, 54, 68; 437/195

[56] References Cited

FOREIGN PATENT DOCUMENTS

| | | | |
|---|---|---|---|
| 58-4947 | 1/1983 | Japan | 437/195 |
| 60-49649 | 3/1985 | Japan | 357/71 |
| 61-160953 | 7/1986 | Japan | 437/195 |

OTHER PUBLICATIONS

"Webster's Dictionary" ©1984 p. 130.
IBM Tech. Disclosure Bulletin, "3-Dimensional Dual Insulator Memory" Arnett, vol. 16 No. 11 Apr. 1974 p. 3517.
IBM Tech. Dislclosure Bulletin, "Encapsulation For Semiconductor Device" Gates, vol. 8 No. 11 Apr. 1966 p. 1687.
IBM Tech. Disclosure Bulletin, "Adhesion of Dielectrics to Noble Metal Via Electroless Deposition" vol. 18 #5 Oct. 1975 pp. 1636 Romankiw.

Primary Examiner—Jerome Jackson, Jr.
Assistant Examiner—D. Monin
Attorney, Agent, or Firm—Benman & Collins

[57] ABSTRACT

Before spin-on-glass (SOG) is applied and soft-cured over metal traces (10) having a height/width aspect ratio (of the spaces) of at least 1, the aluminum metal traces are selectively coated with selective tungsten (16). After SOG (18) is spun on and soft-cured, it is etched back to expose the metal interconnects. A selective tungsten wet etch in $H_2O_2$ detaches the SOG from the metal walls, leaving slit-like voids (20). Stress-free SOG hard curing may now proceed. A capping layer (22) of SOG may now be applied, soft-cured, then hard-cured. Alternatively, other dielectric materials may be applied as the capping layer. Further, interfacial lateral sidewall voids (24) may be deliberately left unfilled, by employing a capping layer (24') of vapor-deposited oxide. The unfilled voids have a dielectric constant of 1.0, which is useful in extremely high speed devices. The resulting structure is comparatively stress-free as fabricated and is resistant to later environmentally-induced brittle tensile fracture.

3 Claims, 1 Drawing Sheet

AVOIDING SPIN-ON-GLASS CRACKING IN HIGH ASPECT RATIO CAVITIES

This is a continuation of co-pending application Ser. No. 07/385,649 filed on Jul. 25, 1989 now abandoned.

BACKGROUND OF THE INVENTION

1. Field of the Invention

The present invention relates generally to multilevel interconnections formed in integrated circuits (ICs) employing spin-on-glass planarization.

2. Description of the Related Art

Spin-on-glasses typically crack when hard-cured in cavities of aspect ratio greater than one due to tensile brittle fracture induced by shrinkage. This is especially true when the spin-on-glass (SOG) is subjected to later thermal shock and cycling. It is also especially true when the spin-on-glass is not fully encapsulated by other CVD-based oxides. This is unfortunate, since such encapsulation is cost-intensive and defect-prone. To avoid this problem, aspect ratios must be kept to $\leq 1$ to provide acceptable process yields and process margins. Frequently, double spins of SOG and even interleaved chemical vapor depositions (CVD) between SOG spins are required to approach an SOG aspect ratio (height/width) of 1 or greater. This has the effect of minimizing the maximum shrinkage and thus the maximum stress and thus the cracking tendency. Such elaborate measures increase the process cost, and they still limit device packing density, which could benefit by aspect ratios of 2 to 3 which are beyond the reach of such measures.

SUMMARY OF THE INVENTION

Accordingly, it is an object of the present invention to provide an SOG dielectric structure which eliminates stress-cracking of spin-on glass used in multi-level metal interconnects such that no CVD dielectrics are required for stress-cracking avoidance.

It is another object of the present invention to provide a process for implementing such a structure using existing SOG materials in a manner such that the stresses are actively and purposefully relieved.

In accordance with the invention, a structure and process are provided for relieving stress in spin-on-glass employed in multi-level interconnects. In the process, a selective tungsten coating is grown on the exposed surfaces of the low-resistivity metal interconnects which are to be planarized with an overlying dielectric. Spin-on-glass is then blanket-deposited everywhere, including between interconnects, typically with the usual spinner application method known to the art. The spin-on-glass is then soft-cured and etched back to expose the surfaces of the metal interconnects. Next, the tungsten coating is removed from the tops and sides of the metal interconnects, which acts not only to relieve the initial small stress in the SOG due to soft curing but also mechanically decouples the SOG from the interconnects before it undergoes the shrinkage associated with the hard curing process. Thus, the tungsten removal leaves laterally free-standing spin-on-glass, which is then hard-cured. The tungsten removal effectively renders the aspect ratio as unimportant from a stress point of view. This is because the interconnects no longer hinder SOG shrinkage. In fact, now high aspect ratio "towers" of SOG will actually have lower stress than non-decoupled low-aspect ratio SOG regions. Finally, a capping layer of spin-on-glass is deposited, soft-cured, and then hard-cured. In this manner, cracking of the spin-on-glass is avoided.

Using the teachings of this invention, one may create interconnect structures having aspect ratios of 1 and greater, thus obtaining higher speed through the use of thicker, lower resistance interconnects as well as more compact devices in cases where lateral fringe capacitance is not dominating. Given the process and structure, the cost and complexity of the planarization process is dramatically reduced.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is now made in detail to a specific embodiment of the present invention, which illustrates the best mode presently contemplated by the inventors for practicing the invention. Alternative embodiments are also briefly described as applicable.

Figure 1:
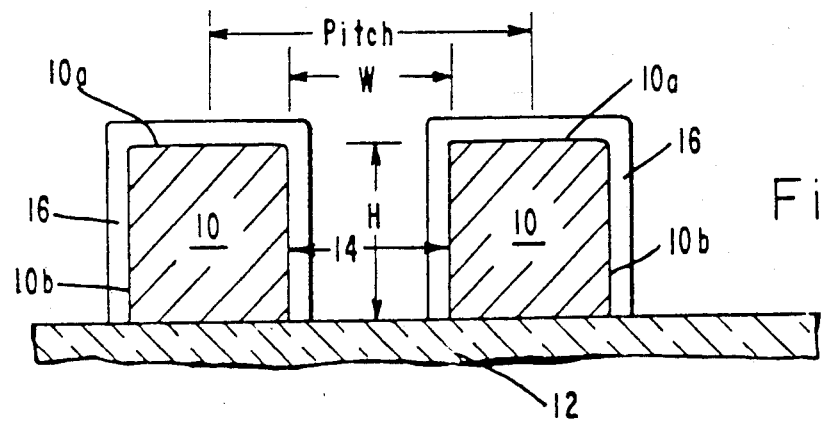
FIGS. 1–3 are cross-sectional views of the process of the invention.

Shown in FIG. 1 are two metal interconnects 10 formed on a dielectric substrate 12. The metal interconnects 10 may comprise aluminum or an alloy thereof or other low resistivity metal, as is well-known in the art.

The metal interconnects are separated by a space 14. In the practice of the invention, there are, of course, a plurality of separated metal interconnects 10 formed on the surface of at least one dielectric level 12. Each of these interconnect levels has to be patterned and then planarized and insulated with a dielectric material. At the present time, spin-on-glass (SOG) is used in connection with CVD oxides, since SOG is convenient to apply and is a low cost process compared to not using SOG and planarizing CVD oxides with resist-etchback methods instead.

In the process of the invention, a selective tungsten coating 16, typically about 500 to 3,000 Å thick is grown on the metal interconnects 10 having a pitch and thickness such that the cavity (before tungsten deposition) has an aspect ratio (height H/width W) $\geq 1$. As is known to the art, the selectivity of the selective tungsten process is rapidly degraded as thickness is increased into the 5,000 to 10,000 Å range. Accordingly, selective tungsten is preferably deposited in the self-limiting thickness regime of about 500 to 900 Å, for example, at about 700 Å, where the selectivity is essentially perfect. The tungsten coating 16 covers the exposed interconnects 10, typically the tops 10a and sides 10b, as shown in FIG. 1.

An SOG coating 18, such as an Allied 100 Series or 200 Series SOG, is spun on thick and soft-cured, typically for 1 minute at each of three increasing temperatures, of which the last and highest is $\approx 250°$ C. The conditions of the soft-cure process per se are well-known in the art and thus do not form a part of this invention. In general, successively higher temperatures are applied to the wafer using a set of sequential hot-plates on which the wafer is placed by a robotic arm. In this manner, the cure is gradual and occurs from the bottom upwards so that solvent can escape. Multiple increasing temperatures also minimize stress and bubbles. Temperatures much higher than about 250° C. for the hottest step build in too much stress, whereas temperatures much lower than about 125° C. will cause non-uniform dry-etching and poor resistance to tungsten wet-etchant to be used later in the process. In general, conditions could be 150° ±25° C. for about 1 to 2 minutes, 200° ±25° C. for about 1 to 2 minutes, and 250° C. for about 1 to 2 minutes. Once the parameters are chosen, they are typically fixed to ±2° C. and ±2 seconds.

The thickness of the SOG coating is chosen to be sufficient to more than cover the interconnects. As is known, the thickness can be influenced either by spin speed or solvent/solids content manipulation.

Figure 2:
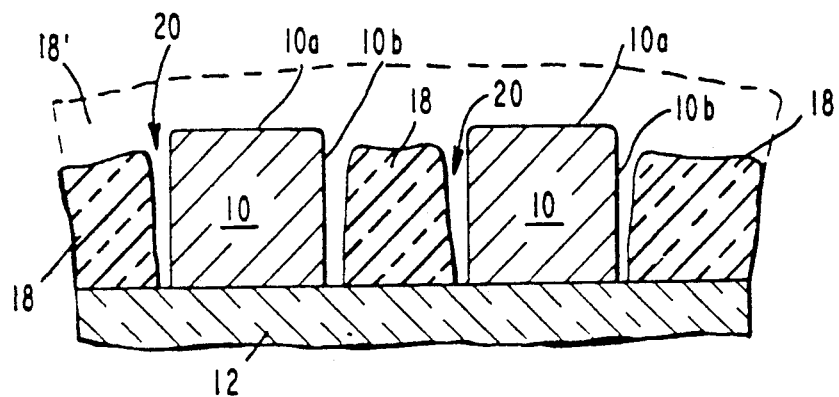

The SOG is then etched back in the typical oxygen-/chlorofluoro chemistries to expose the tops 10a of the metal interconnects 10, as shown in FIG. 2. The original SOG coating prior to the etch-back is shown in phantom and denoted 18' in FIG. 2 If the tungsten 16 o the sidewalls 10b is already gone at this point, it is then completely removed by a wet dip which contains $H_2O_2$ or any other isotropic wet or dry etchant which does not attack aluminum or soft-cured SOG. Such a dip also serves to clean up organic residue from the etch-back process. This leaves laterally free-standing SOG portions 18 which can now be hard-cured. The conditions of the hard-cure process per se are well-known in the prior art and thus do not form a part of this invention. Typically, it involves a 400° C. exposure for at least 30 minutes. The significant fact is that the hard cure, necessary to gain the final SOG properties, is normally what induces shrinkage cracking or incipient cracking and large tensile stress. The shrinkage must occur for the required molecular restructuring to take place. FIG. 2 shows the SOG portions 18 after the hard-cure detached from the sidewalls 10b of the interconnects 10.

It will be noted that voids 20 are formed between the aluminum interconnects 10 and the SOG 18, due to the removal of the tungsten coating 16. These voids 20 are wider at the top, due to the SOG shrinkage during hard cure which would have otherwise caused immediate high tensile stress and subsequent tensile failure either immediately or upon later wafer processing or device packaging.

Figure 3:
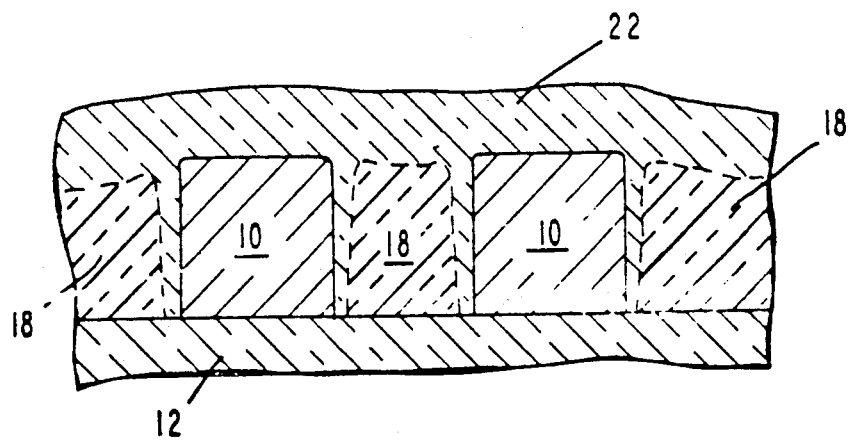

Next, a capping SOG layer 22 is spun on and soft-cured, then hard-cured directly. The conditions of the soft-cure and hard cure processes are within the known prior art values. FIG. 3 shows the completed structure. The metal sidewall voids 20 (seen in FIG. 2), actually slits, will not crack with the new SOG, due to the cumulative shrinkage strain being almost zero over such a small lateral gap. Even if it did crack, such a crack would be virtually invisible and structurally insignificant. The material comprising the capping layer 22 may alternatively comprise plasma CVD TEOS (tetra-ethyl ortho silicate) oxide deposited at ≈410° C., as is well-known in the art.

Alternative dielectric capping layers 22 include polyimides, silicones, silicon oxides, silicon nitrides, or silicon oxynitrides. Such dielectric materials may be applied by such well-known processes as LPCVD (low pressure CVD), PECVD (plasma enhanced CVD), or PVD (physical vapor deposition). Such processes employ chemicals and temperatures that are compatible with the metal interconnects 10.

In this manner, SOG stresses are not permitted to build up and CVD layers can potentially be completely eliminated, since they are not needed to keep the SOG material to a minimum both in volume and aspect ratio. It should be noted that this tungsten deposition/SOG etch-back/tungsten strip/SOG hard-cure process could be done more than once at a given level of interconnect if the SOG is etched back beyond the surface of the metal. In this manner, aspect ratios of 2 or 3 and even greater are obtainable, yet at no time does any free-standing SOG element approach such a high aspect ratio, thus minimizing the additional concern of vibration-induced SOG fracture.

Figure 4:
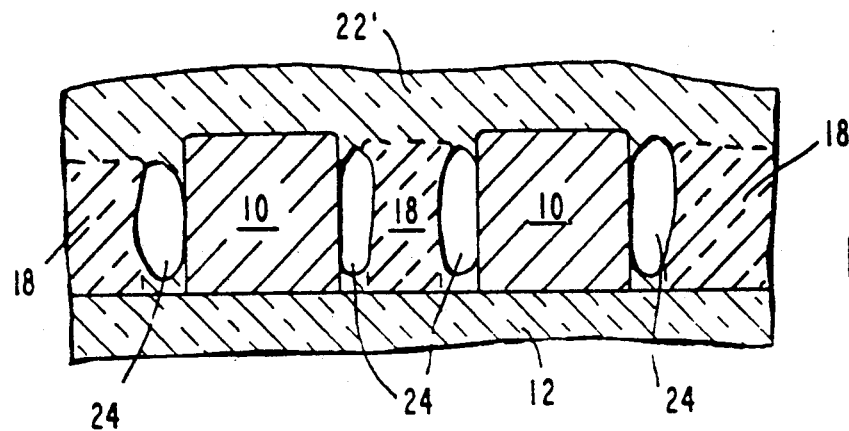
FIG. 4 is a cross-sectional view depicting an alternate embodiment.

In an alternative embodiment, the selective tungsten 16 may be relatively thick, say about 1,000 to 3,000 Å, such that when it is stripped, one may cap with CVD oxide 22', leaving behind permanent interfacial lateral sidewall voids 24 (FIG. 4) of dielectric constant = 1.0 for extremely high speed. The capping layer 22' of FIG. 4 is chosen to be CVD or PVD oxide rather than SOG because it will leave voids 24 unfilled.

The process of the invention may be used in any multi-level IC which can employ spin-on-glass planarization, such as CMOS (complementary metal oxide semiconductor), BiCMOS (bipolar CMOS), bipolar, or NMOS technologies, as well as for GaAs technologies. Examples include four-level metal bipolar ECL (emitter coupled logic) gate arrays, very high speed logic devices, SRAMs (static random access memories), DRAMs (dynamic random access memories) and high speed multi-metal EPROMs (erasable programmable read-only memories).

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other MOS, bipolar, photoelectronic, microwave or photoacoustical fabrication technologies. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. An integrated circuit containing a plurality of low-resistivity metal interconnect layers in which at least two of said adjacent layers are electrically isolated and separated from each other by a cavity having a height H and a width W and occupied by a first layer of a dielectric material consisting essentially of spin-on-glass partially detached from adjacent interconnect sidewalls and by a second layer of a dielectric material which covers the top of said interconnects and fills at least a portion of a region between said first layer and said sidewalls, leaving a region of closed space located interfacially on said sidewalls, said region having a dielectric constant approximately equal to 1, thereby permitting use of cavities having an aspect ratio of H/W of at least about 1 between said interconnects.

2. The integrated circuit of claim 1 wherein said aspect ratio is greater than 1.

3. The integrated circuit of claim 1 wherein said second layer of dielectric is selected from the group consisting of CVD and PVD oxide.

* * * * *